United States Patent [19]

Trischler

[11] Patent Number: 4,534,028

[45] Date of Patent: Aug. 6, 1985

[54] RANDOM TESTING USING SCAN PATH TECHNIQUE

[75] Inventor: Erwin Trischler, North Brunswick, N.J.

[73] Assignee: Siemens Corporate Research & Support, Inc., Iselin, N.J.

[21] Appl. No.: 556,812

[22] Filed: Dec. 1, 1983

[51] Int. Cl.³ ............................................. G01R 31/28
[52] U.S. Cl. .................................... 371/25; 324/73 R
[58] Field of Search ................. 371/25, 15; 324/73 R, 324/73 AT

[56] References Cited

U.S. PATENT DOCUMENTS

| | | | |
|---|---|---|---|
| 3,376,695 | 9/1973 | Eichelberger | 371/25 |
| 4,298,980 | 11/1981 | Hajdu et al. | 371/25 |
| 4,340,857 | 7/1982 | Fasang | 324/73 R |
| 4,423,509 | 12/1983 | Feissel | 371/25 |
| 4,493,077 | 1/1985 | Agrawal et al. | 371/25 |

FOREIGN PATENT DOCUMENTS 2111493  9/1972  Fed. Rep. of Germany .

OTHER PUBLICATIONS

T. W. Williams et al., Random Patterns Within a Structured Sequential Logic Design, 1977 Semiconductor Test Symposium, Cherry Hill, N.J., Oct. 1977, pp. 19–27.
"Built–in Test for Complex Digital Integrated Circuits" by Koenemann et al., IEEE Journal of Solid–State Circuits, vol. SC, No. 3, Jun. 1980, pp. 315–319.
J. H. Stewart, Application of Scan/Set for Error Detection and Diagnostics, 1978 Semiconductor Test Conference, Cherry Hill, N.J., Oct. 31–Nov. 2, 1978, pp. 152–158.

Primary Examiner—Charles E. Atkinson
Attorney, Agent, or Firm—Karl F. Milde, Jr.

[57] ABSTRACT

A method is disclosed for testing a complex digital circuit that is designed as a serial access scan path. The circuit incorporates a number of flip-flops, at least some of which are selectively connectable into a scan path shift register. The circuit also has a number of primary inputs, primary outputs, a scan path input and a scan path output. In the testing method, a first digital test pattern is applied to the primary inputs and a second digital test pattern is shifted into the scan path shift register. The digits appearing at the primary outputs are repeatedly compared with those of a first digital number indicative of the proper operation of the circuit as each digit of the second digital test pattern is shifted into the scan path shift register. If the digits appearing at the primary outputs are not equal to those of the digital numbers to which they are compared, a signal indicative of faulty circuit operation is produced.

5 Claims, 12 Drawing Figures

RANDOM TESTING USING SCAN PATH TECHNIQUE

BACKGROUND OF THE INVENTION

The present invention relates to a technique for testing complex digital circuits.

In the development of digital equipment, particularly computer and data processing equipment, circuit density has been increasing exponentially. This growth is attributed to the general advancement in semiconductor technology, in the computer sciences, and in the processes related to component miniaturization.

Since increases in chip circuit density are reflected in reduced costs per gate, cost reduction can be achieved by increasing the level of circuit integration; that is, by increasing the number of gate functions per chip. While this number has been increasing exponentially, the number of pins per chip has been increasing only approximately linearly. Inasmuch as the number of pins cannot be easily increased because of practical mechanical limitations, the number of gates per pin has also been increasing exponentially. Consequently, the accessability to internal nodes of integrated circuit chips is becoming increasingly difficult.

It is well known that test costs have been rising exponentially in correspondence with the aforementioned growing complexity and density of digital circuits. The ratio of test cost to total product cost has also been increasing with time. The testability of digital circuits is now receiving considerable attention because of the substantial economic impact of testing these circuits.

Studies have shown an order of magnitude increase in fault localization costs at various stages of testing. According to the report "Testability", by J. Turino, ATE Seminar, Pasadina, CA., January 1981., the cost of finding a single faulty component is approximately:

$0.05 at chip receiving test stations (sample testing),
$0.50 at chip receiving test stations (100% testing),
$5.00 at the printed circuit board level,
$50.00 at the systems test level, and
$500.00 in the field.

Thus, the earlier in the manufacturing process that a fault can be found, the lower is the cost. Considerable research effort has therefore been directed to:

(a) Moving fault localization to the earliest testing stage by considering it initially during the circuit design phase; and
(b) Easing the testing and fault localization process to reduce the cost at each step.

Since the methods of testing generation and simulation used thus far have, in many cases, reached the limit of their capability, suitable alternative testing approaches are being sought. One such approach is to design the network architecture and structure for easy testability during the circuit design phase. This approach is called "design for testability".

Using design for testability, significant test cost reduction is achieved by adding some additional hardware that transforms a circuit network, which is difficult to test into an easy to test one. This simplifies the test generation procedure (replacement of manual test generation by automatic test pattern generation systems), reduces simulation costs, reduces the number of test patterns, and therefore the costs of automatic test equipment.

Most structured design for testability practices are based on the concept that, if the state of all flip-flops can be controlled to any specific value, and if they can be observed with every straightforward operation, then test generation and a fault simulation can be reduced to that required for a combinational logic network. A control signal can switch the flip-flops from their normal mode of operation to a mode that makes them controllable and observable. Structures which permit such operation are known in the art as "scan structures".

For example, the U.S. Pat. No. 3,761,695 to Eichelberger discloses a testing technique for a digital circuit wherein internal storage elements (other than memory arrays), are connected such that they can also operate as shift registers and thus provide a so-called "scan path".

A scan path has two modes of operation: one which is the normal function mode, and a second which is a test mode wherein flip-flops of the circuit are interconnected into one long shift register called a "scan path". With the circuit in the test mode, it is possible to shift (load) an arbitrary test pattern into the flip-flops. By returning the circuit to its normal mode for one clock period, the remaining circuit acts upon the flip-flops' contents and primary input signals and stores the results in the scan flip-flops. If the circuit is then placed back into test mode, it is possible to shift out (unload) the contents of the scan flip-flops and compare these contents and the primary output signals with the appropriate correct values.

The n-th flip-flop in the shift register of the length k can be controlled after n ($k \geq n$) clock pulses.

If all flip-flops are included in a scan path, it is identified as a complete or full scan whereas, if some flip-flops are not included in the scan structure, it is identified as an incomplete or partial scan. A complete scan path assumes that all flip-flops of a circuit, except memory arrays (ROMs, RAMs, etc.), are included in the scan path. The remaining circuit outside of the scan path is purely combinational, and this allows very efficient execution of automatic test generator and fault simulation programs. An incomplete scan path assumes that a given number of flip-flops are not included in the scan path. Flip-flips that are easily controllable or observable are often omitted from the scan path leaving only the flip-flops in the scan path which cannot otherwise be tested.

The portion of the network that remains after removing the scan flip-flops will be subsequently referred to here as the "remaining portion" or "remainder of the network".

If the flip-flops outside of the incomplete scan path are asynchronous, then four typical configurations of the flip-flops can be identified with respect to the incomplete scan path. These four cases are illustrated in FIGS. 1A-1D, respectively. Asynchronous flip-flops are commonly used in many networks. In cases A or B the asynchronous flip-flops can be controlled only via primary inputs. These two configurations are called "optimal" (optimal incomplete scan path) because they can be treated as networks with a complete scan path. Fault detection takes place either on primary outputs (case A) or on scan path flip-flops (case B) whose contents must be shifted out.

Because the number of times the asynchronous flip-flops must be controlled and checked may exceed the number of times the scan path is loaded and unloaded, the configuration of case A is more favorable than the configuration of case B. When using an automatic tester, this means that the testing can be done faster in case A than in case B for networks of equal complexity and size.

If the asynchronous flip-flops external to the scan path are controlled by scan path flip-flops (FIGS. 1C and 1D) the overall network and the entire shift operation for pattern loading and unloading of the scan path must be simulated because the states of the asynchronous flip-flops may be influenced by the shifting of a test pattern through the scan path flip-flops. Such a configuration is therefore called "non-optimal" (non-optimally implemented incomplete scan path).

The problem with a non-optimal, incomplete scan path network is that the states of the asynchronous flip-flops are influenced by the application of a test pattern to scan flip-flops such that, unless the overall network and the applied test pattern are simulated, it is not possible to determine the states of the asynchronous flip-flops with full certainty. This is particularly true of the remaining portion of networks with a sequential depth greater than one. This makes it necessary to proceed differently for modeling and for test generation. Although ATG can still be confined to the remaining portion of the network, the resulting patterns must be verified at the level of the overall network by fault simulation.

A characteristic of a non-optimal incomplete scan path is that the loading of test patterns must be simulated. The loading of a test pattern into an incomplete scan path can be seen as the application of test patterns which are similar to "pseudorandom" test patterns on the inputs of the remaining circuit. In other words these patterns detect faults in the remainder of the network only by chance.

SUMMARY OF THE INVENTION

It is an object of the present invention to provide a method for testing a complex digital circuit which is designed for testability as a scan structure.

It is another object of the present invention to provide a method for testing a complex digital circuit having a number of primary inputs, a number of primary outputs and a plurality of flip-flops, some of which are selectively connectable into a shift register to form a scan path.

It is another object of the present invention to provide a method for testing a complex digital circuit having a non-optimal, incomplete scan path which avoids or minimizes the problems described above in the "Background of the Invention".

These objects, as well as further objects which will become apparent from the discussion that follows, are achieved, according to the present invention, by a method comprising the steps of:

(1) forming the scan path shift register in the complex digital circuit;
(2) clearing the scan path shift register;
(3) applying a first digital test pattern to the primary inputs;
(4) shifting the first digit of a second digital test pattern into the scan path shift register;
(5) comparing the digits appearing at the primary outputs with those of a first digital number indicative of the proper operation of the circuit;
(6) shifting the next digit of the second digital test pattern into the scan path shift register;
(7) comparing the digits appearing at the primary outputs with those of another digital number indicative of the proper operation of the circuit;
(8) repeating steps (6) and (7) for each successive digit of the second test pattern until all of the stages of the scan path shift register have been filled; and
(9) producing a signal indicative of faulty circuit operation if the digits appearing at the primary outputs are not equal to those of the digital numbers to which they are compared.

For a full understanding of the present invention, reference should now be made to the following detailed description of the preferred embodiments of the invention and to the accompanying drawings.

DESCRIPTION OF THE PREFERRED EMBODIMENTS

Figure 1A:
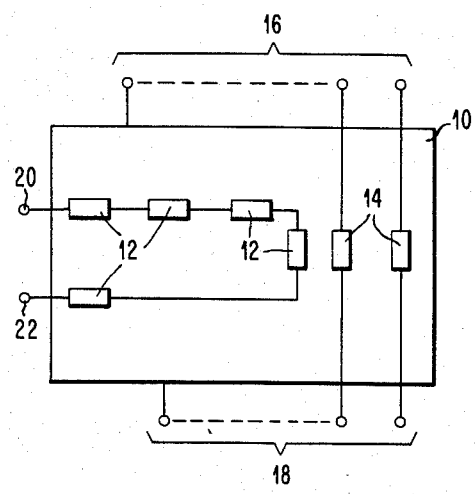
FIGS. 1A, 1B, 1C and 1D are representational diagrams of digital circuits having an incomplete scan path and optimal (FIGS. 1A and 1B) and non-optimal (FIGS. 1C and 1D) configurations of flip-flops external to this scan path.
Figure 1B:
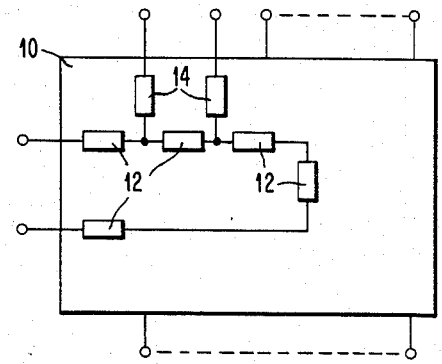

The preferred embodiments of the present invention will now be described with reference to FIGS. 1-7 of the drawings. Identical elements in the various figures are identified by the same reference numerals.

FIGS. 1A-1D each show a complex digital circuit 10 having within it a number of flip-flops 12 and 14. When the circuit 10 is operating in the normal mode, the flip-flops 12, 14 are connected to provide the various normal circuit functions. For this purpose, the circuit 10 also has a number of primary inputs 16 and a number of primary outputs 18. When in the test mode, the flip-flops 12 (which may or may not include all the flip-flops of the circuit 10) are connected together serially to form a shift register, or so-called "scan path", with a shift register input 20 and shift register output 22. Thereafter, a first test pattern number containing "1's" and "0's" is shifted into this register via the shift register input 20. After this test pattern has been shifted in completely, the circuit is operated normally for one clock cycle with a second test pattern applied to the primary inputs 16. This operation causes the flop-flops to be "exercised" in a certain known way.

After application of the second test pattern at the primary inputs and the operation for one clock cycle, the states of the primary outputs are latched and compared to their known, correct states. Thereafter, the digital number which is stored in the scan path shift register is shifted out via the output 22 and compared to its correct number (i.e., the number that would be stored in the shift register at the completion of the test if the circuit 10 were working properly).

As has been described above, the flop-flops 14 outside of the scan path can be controlled by signals from the primary inputs 16. These two configurations are called "optimal" because the flip-flops 14 can be directly tested by applying signals to their inputs and checking their outputs, either directly in the circuit of FIG. 1A, or indirectly via the scan path shift register in the circuit of FIG. 1B.

Figure 1C:
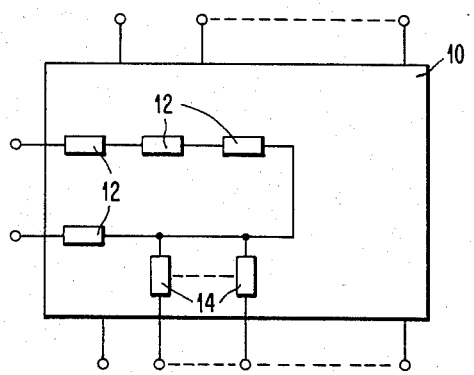
Figure 1D:
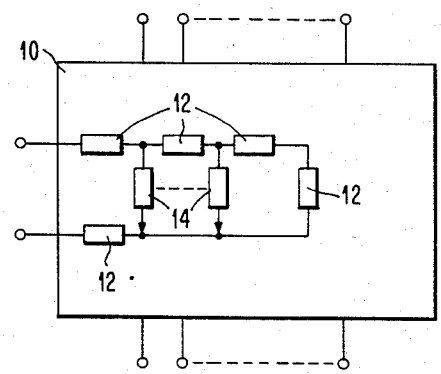

In the circuits of FIGS. 1C and 1D the flip-flops 14 external to the scan path are controlled by the scan path flip-flops 12. In this case, the overall network and the entire shift operation for pattern loading and unloading of the scan path must be simulated because the states of the flip-flops 14 may be influenced by the shifting of test patterns into the scan path shift register. For this reason, the flip-flop network configurations of FIGS. 1C and 1D are called "non-optimal".

The so-called "scan path technique" described above for testing a digital circuit has been known in the art for some time. This technique is described, for example, in the aforementioned U.S. Pat. No. 3,761,695 to Eichelberger; the German Patent publication (AS) No. 2,111,493 to Huelters and the article "Built-In Test for Complex Digital Integrated Circuits" by Koenemann et al., IEEE Journal of Solid-State Circuits, Vol. SC-15, No. 3, June 1980, pp. 315-319. While this testing technique is usually adequate for circuits with a complete scan path, and even for circuits with an optimal, incomplete scan path, it is inadequate for complex digital circuits having a non-optimal, incomplete scan path. As noted above in the "Background of the Invention" section, the loading of a test pattern into a circuit with a non-optimal, incomplete scan path produces what may be viewed as "pseudorandom" test patterns on the inputs of the remaining network. Faults in this remaining portion of the circuit are therefore detected only by chance.

With the testing method according to the present invention, it is possible to substantially increase the fault coverage (that is, the percentage of faults detected) in the remaining portion of a circuit having a non-optimal, incomplete scan path.

Figure 2:
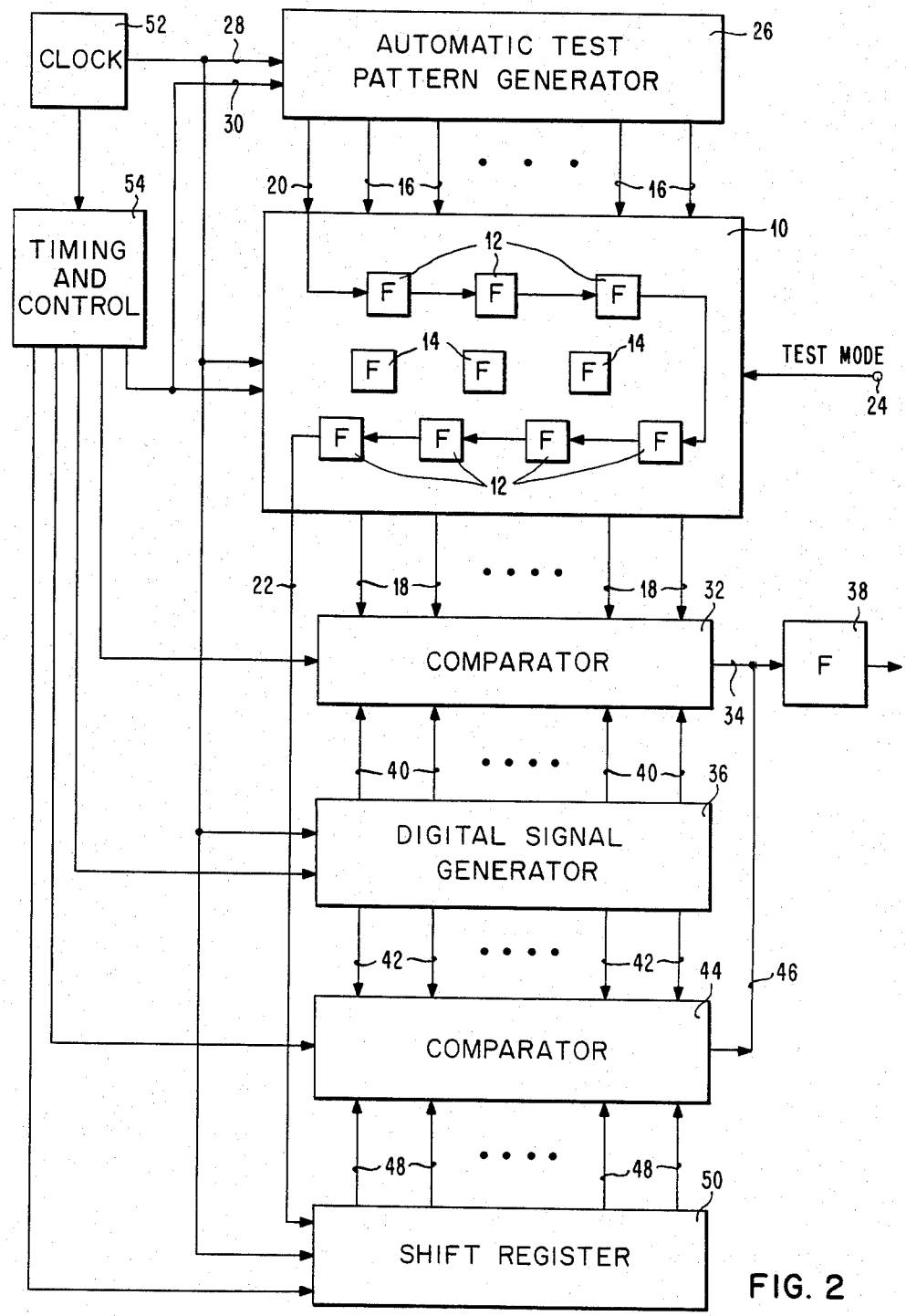
FIG. 2 is a block diagram of apparatus for testing a digital circuit according to the method of the present invention.

FIG. 2 illustrates apparatus for implementing the method according to the invention for testing a complex digital circuit 10 with a non-optimal, incomplete scan path. As in the circuits of FIGS. 1A-1D, the circuit 10 comprises flip-flops 12 which may be connected together to form a scan path shift register and flip-flops 14 which remain external to this shift register when the circuit 10 is in the test mode.

The circuit 10 has a separate input 24 for selection of either its normal mode, wherein all the flip-flops are connected normally to implement the circuit functions, or the test mode wherein the flip-flops 12 are connected together serially to form the scan path. In FIG. 2, the circuit 10 is shown in its test mode configuration with its primary inputs 16, its primary outputs 18 and its scan path input 20 and output 22 connected to testing apparatus.

The testing apparatus comprises an automatic test pattern generator 26 adapted to apply a digital test pattern to the primary inputs 16 and to the scan path input 20 in response to timing signal at its clock inputs 28 and 30. The primary outputs 18 of the circuit 10 are connected to a comparator 32 which produces a signal at its ouput 34 when the states of the primary outputs 18 do not correspond to the 1's and 0's of a known digital number produced by a digital signal generator 36. This digital number reflects the correct states of the primary outputs 18 if the circuit 10 were operating properly. The output of the comparator is latched into a flip-flop 38 which indicates whether the circuit 10 is faulty.

The digital number applied to the comparator 32 by the digital signal generator 36 is supplied via one set of outputs 40. The digital signal generator 36 also supplies another digital number via a second set of outputs 42 to a second comparator 44. This comparator produces a signal at its output 46 when the number received from the digital signal generator 36 does not equal a number received via inputs 48 from a shift register 50.

The circuit 10, the automatic test pattern generator 26, the digital signal generator 36, the comparators 32 and 44 and the shift register 50 receive timing signals from a clock pulse generator 52 and a timing (clock divider) circuit 54.

The apparatus shown in FIG. 2 operates in the following manner. Initially, the seven flip-flops 12 in the scan path shift register are cleared to "0". Thereafter, the first digital test pattern is generated by the automatic test pattern generator (ATG) 26 and applied to the primary inputs 16 of the circuit 10. This test pattern remains constant during the entire test of the circuit 10.

Next, the ATG 26 shifts the first digit of a second digital test pattern into the scan path shift register via the scan path intput 20. Since in this example there are seven flip-flops in the scan path shift register, this second digital test pattern consists of seven digits.

Next, the digits appearing at the primary outputs 18 of the circuit 10 are compared in comparator 32 with the respective digits of a first digital number generated by the digital signal generator (DSG) 36. This digital number is indicative of the proper operation of the circuit; that is, it represents the states the primary outputs 18 would be if the circuit 10 were operating properly.

Thereafter, the next digit of the second digital test pattern is shifted into the scan path shift register by the ATG 26 via the scan path input 20. Again, the states of the primary outputs are compared with the digits of a second digital number generated by the DSG 36 and indicative of the proper operation of the circuit 10.

The shifting of digits of the second digital test pattern into the scan path shift register and the subsequent comparison of the states of the primary outputs 18 with digits of a number generated by the DSG 36 is repeated. Whenever the comparator 32 indicates a condition of non-equal inputs, a signal at its output 34 is latched into the flip-flop 38.

As will be shown below, the shifting and subsequent comparison steps increase the fault coverage for the remaining portion of the circuit; i.e., for the flip-flops 14 and their associated gates which are not in the scan path shift register.

After the desired number of the second test pattern digits have been shifted into the scan path shift register and the states of the primary outputs have been checked, the remaining digits of the second test pattern are shifted in until all the stages of the scan path shift register are filled. Thereafter, the circuit is operated or "exercized" for one or more clock cycles and the states of the primary outputs are checked again for correctness.

After completion of the test procedure described above, the contents of the scan path register are shifted out via the scan path output 22 into the second shift register 50. When all seven digits of the scan path shift register have been shifted into the shift register 50, the respective digits stored in this shift register 50 are compared in the comparator 44 with another digital number appearing at the outputs 42 of the DSG 36 and indicative of the proper operation of the circuit 10. If the respective digits received from the shift register 50 and the DSG 36 are not equal, the comparator 44 produces a signal at its output 46 which is latched into the flip-flop 38.

The shifting and testing of digits according to the method of the present invention is illustrated in the following TABLE 1. This table demonstrates how a seven digit test pattern—in this case "0110101"—is shifted from the ATG 26 through the scan path shift register in the circuit 10 into the shift register 50.

TABLE 1

| STEP | TEST PATTERN | CIRCUIT | OUTPUT |
|---|---|---|---|
| 0 | . | 1 1 0 1 1 0 0 | |
| 1 | 0 1 1 0 1 0 1 . | 0 0 0 0 0 0 0 . | 0 0 0 0 0 0 0 |
| 2 | 0 1 1 0 1 0 . | 1 0 0 0 0 0 0 . | 0 0 0 0 0 0 0 |
| 3 | 0 1 1 0 1 . | 0 1 0 0 0 0 0 . | 0 0 0 0 0 0 0 |
| 4 | 0 1 1 0 . | 1 0 1 0 0 0 0 . | 0 0 0 0 0 0 0 |
| 5 | 0 1 1 . | 0 1 0 1 0 0 0 . | 0 0 0 0 0 0 0 |
| 6 | 0 1 . | 1 0 1 0 1 0 0 . | 0 0 0 0 0 0 0 |
| 7 | 0 . | 1 1 0 1 0 1 0 . | 0 0 0 0 0 0 0 |
| 8 | . | 0 1 1 0 1 0 1 . | 0 0 0 0 0 0 0 |
| 9 | . | 0 1 1 0 1 0 . | 1 0 0 0 0 0 0 |
| 10 | . | 0 1 1 0 1 . | 0 1 0 0 0 0 0 |
| 11 | . | 0 1 1 0 . | 1 0 1 0 0 0 0 |
| 12 | . | 0 1 1 . | 0 1 0 1 0 0 0 |
| 13 | . | 0 1 . | 1 0 1 0 1 0 0 |
| 14 | . | 0 . | 1 1 0 1 0 1 0 |
| 15 | . | . | 0 1 1 0 1 0 1 |

The flip-flops 12 of the circuit 10 are initially in random states (step 0). The successive states "1101100" are illustrated as an example. The circuit 10 is then set into a test mode whereby the flip-flops 12 are connected serially into a shift register and cleared to "0⇌ (step 1). Thereafter, the test pattern "0110101" is shifted into the scan path shift register, digit by digit (steps 2-8) and the states of the primary outputs are tested for correctness after each shift operation. Depending upon the location of the flip-flops within the circuit 10 (how close they are to the primary outputs 18), this testing procedure may considerably increase the fault coverage for the flip-flops 14 and their associated gates.

Thereafter, after the circuit 10 has been "exercized" and the primary outputs have again been checked for correctness, the contents of the scan path shift register are shifted out, digit by digit, into the shift register 50 (steps 9-15). Finally, the contents of the shift register are checked for correctness.

It should be noted that the states of the scan path shift register comprising the flip-flops 12 may change during the testing process. For ease of understanding the test pattern "0110101" is shown as passing through the scan path shift register unchanged into the shift register 50. It will be understood, however, that the contents of the shift register 50 at the completion of the test procedure will normally be different from the original test pattern supplied to the scan path shift register.

As noted above, the method of testing according to the present invention considerably increases the circuit fault coverage as compared to the prior known methods (described above in connection with FIG. 1A). This improvement will now be explained with reference to FIG. 3.

In the test mode, the test generator 26 produces a test pattern and loads it into the incomplete scan path initially containing all 0's. After loading, this pattern will detect all "stuck-at" faults along the dark lines indicated in FIG. 3.

Eight clock cycles are required to fully shift the pattern into the desired position in the scan path. Eight intermediate patterns appear during the shifting; however, only the last and desired pattern is simulated in networks with a complete scan path. In case of networks with a non-optimal, incomplete scan path, all eight patterns are simulated. The following TABLE 2 shows all intermediate states and the corresponding detected faults.

TABLE 2

| No. of Clocks | Steps 1 2 3 4 5 6 7 8 | Fault Detection | Fault Coverage | Comment |
|---|---|---|---|---|
| 0 | 0 0 0 0 0 0 0 0 | c' d' f' g' | ↑ | state before loading |
| 1 | 0 | c' d' f' g' | ↑ | |
| 2 | 1 0 | c' d' f' g' | ↑ | |
| 3 | 1 1 0 | g' | ↑ 92.85% | |
| 4 | 0 1 1 0 | a' c° e° f° g° | ↓ | Intermediate |
| 5 | 1 0 1 1 0 | b' e° f° g° | ↓ | states on outputs |
| 6 | 1 1 0 1 1 0 | a° b° e' g' | ↓ | of - flip-flops |
| 7 | 1 1 1 0 1 1 0 | a° b° e' g' | ↓ | |
| 8 | 0 1 1 1 0 1 1 0 | a' e° f° g° | ↑ 28.57% ↓ | Fault detection after loading |

Figure 3:
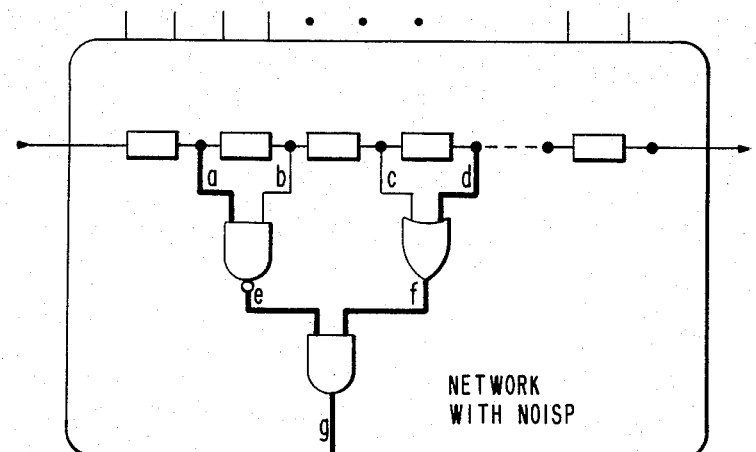
FIG. 3 is a representational diagram of a digital circuit containing a non-optimal, incomplete scan path, and fault detection of the remaining portion of the circuit by "pseudorandom" test patterns.

TABLE 2 illustrates the generation of "pseudorandom" test patterns during loading of the scan path in the circuit of FIG. 3 where a' is stuck at 1 and a is stuck at 0. As can be seen from TABLE 2, 92.85% of the faults are detected during the loading of the first seven patterns; the last (eighth) pattern does not increase the fault coverage.

If the circuit in FIG. 3 has a complete scan path, only the last (eighth) pattern will be simulated and the reported fault coverage will be only 28.57%.

As may be seen, the increase of reported fault coverage through fault simulation of all patterns during the loading of an incomplete scan path can be significant using the method of the present invention.

Experiments with an actual LSI chip (with 651 gates, 39 flip-flops in the scan path and 4 outside) which has a non-optimal, incomplete scan path, also showed a significant increase in fault detection:

Fault detection after loading of last pattern = 18.36%

Fault detection during loading (including last pattern)=83.42%

Figure 4A:
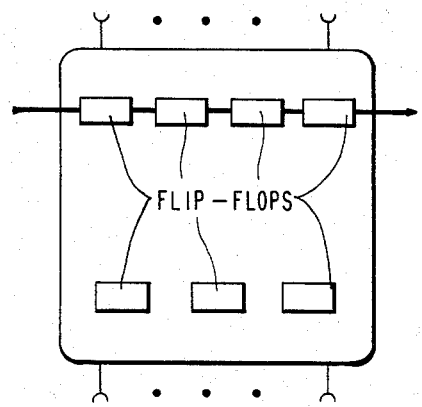
FIGS. 4A and 4B are representational diagrams of digital circuits with incomplete scan paths illustrating a favorable configuration (FIG. 4A) and an unfavorable configuration (FIG. 4B) with respect to the increase of fault coverage.
Figure 4B:
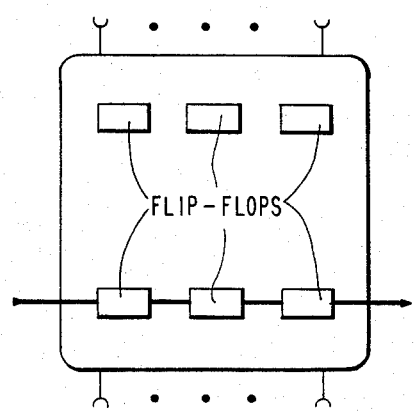

The structure of the network determines whether or not such an increase in fault detection can appear and, if so, how much. Only the portion of the network situated between the scan path flip-flops and the primary outputs can be tested. If this portion is large (as illustrated in FIG. 4A), the increase in fault coverage will be high. If a portion of the network is situated between the primary inputs and the scan path flip-flops as shown in FIG. 4B, fault coverage will be low or impossible. This may be an additional criterion for the choice and placement of an incomplete scan path in a circuit.

After a test pattern is loaded into an incomplete scan path, the network is switched to the normal mode and the system clock is applied for one cycle to allow data transfer to the flip-flops. The states of the primary outputs are checked and the pattern, which represents the states of the incomplete scan path, is shifted out.

Experiments have shown that if the system clock is applied for more than one cycle, the fault coverage is substantially increased.

Figure 5A:
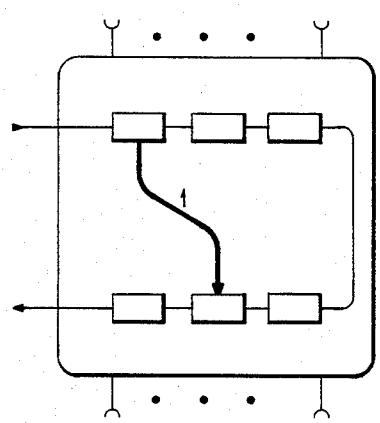
FIGS. 5A and 5B are representational diagrams of a digital circuit with a scan path and illustrating a sensitized path by applying one clock pulse (FIG. 5A) and its extension by applying three clock pulses (FIG. 5B).
Figure 5B:
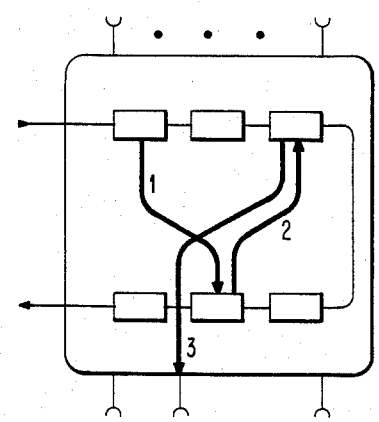

Sensitized paths usually begin either on primary inputs or on flip-flop outputs, and they end either on primary outputs or on flip-flop inputs. Multiple clocking in the normal mode can extend the sensitized paths through several flip-flops and, in such a way, increase the fault coverage. This is illustrated in FIG. 5A (where one clock cycle is applied) and FIG. 5B (three clock cycles). Because of the dependence on the structural properties of the network and the test pattern that is applied, there is no theoretical guarantee that the sensitized paths can be extended.

Figure 6:
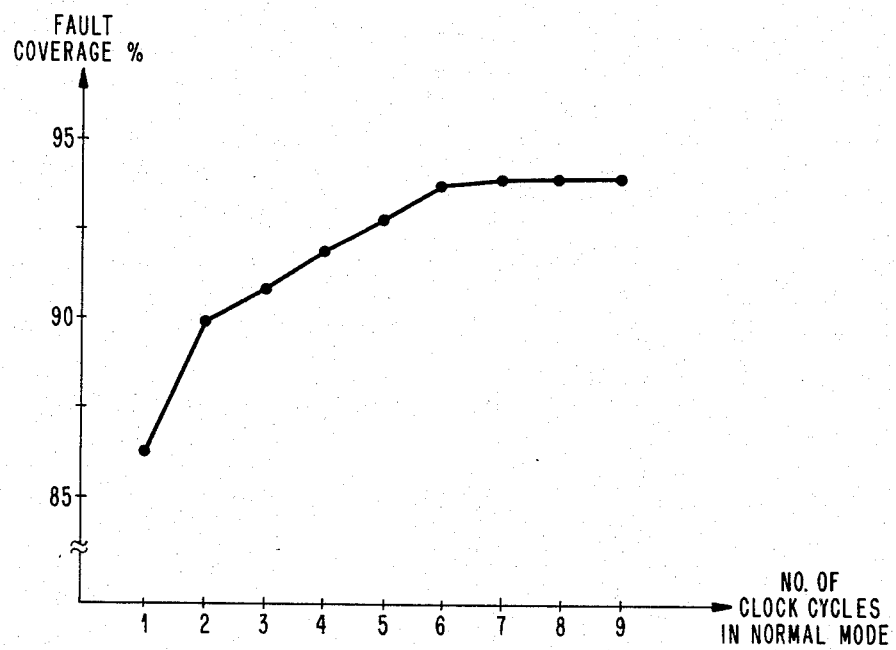
FIG. 6 is a first diagram showing the fault coverage in a digital circuit in dependence upon the number of clock cycles in the normal mode.

Experimental results on an LSI chip have shown a significant increase in fault coverage in dependence upon the clocking in the normal mode. These results are illustrated in FIG. 6. In the LSI circuit test diagrammed in FIG. 6, the incomplete scan path was loaded six times with test patterns that were generated from an ATG program. After switching from the test mode into the normal mode, a varible number of clock pulses were applied (from 1 to 9) As can be seen from the diagram, the fault coverage increased from 86.27% (number of clock cycles=1) to 94.04% (number of clock cycles=9).

In practice, two questions should be answered when designing the test method according to the invention:
(1) Can additional fault coverage be achieved?
(2) If so, how many clock cycles will yield the best results?

Figure 7:
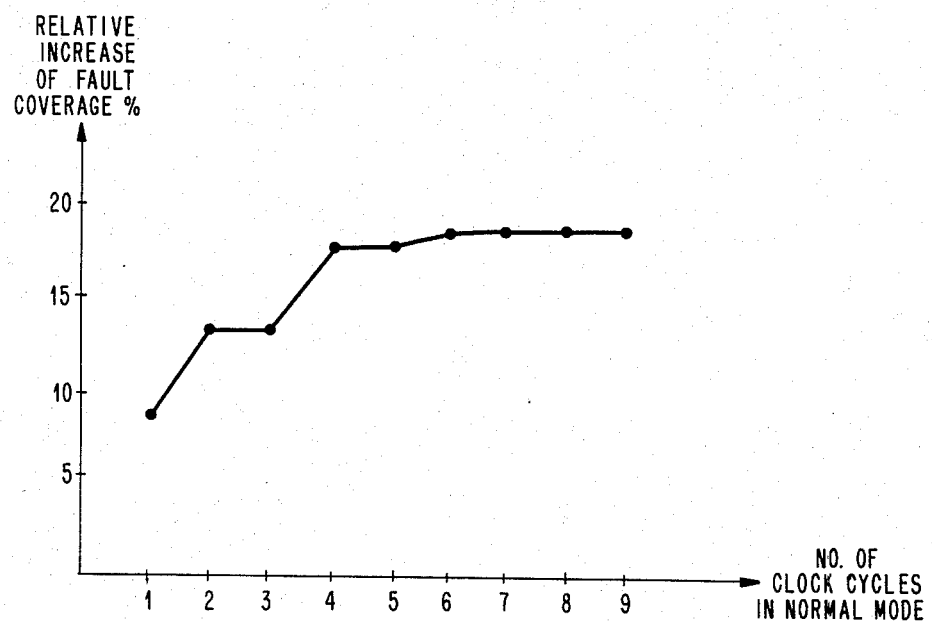
FIG. 7 is a second diagram showing the relative increase of fault coverage in a digital circuit in dependence upon the number of clock cycles in the normal mode for determining the optimum number of clock cycles.

This can be done by varying the number of clock cycles after the first loading of the incomplete scan path as is diagrammed in FIG. 7. From a diagram like FIG. 7 it is possible to determine the number of clock cycles that yield the best results.

For large networks it may be advisable to find an optimum point between the increase in fault coverage and the increase in simulation costs. For the LSI chip used in the experiment described above, there was no significant difference between the simulation time or total costs for one to nine clock cycles.

There has thus been shown and described a novel method of testing complex digital circuits which fulfills all the objects and advantages sought therefor. Many changes, modifications, variations and other uses and applications of the subject invention will, however, become apparent to those skilled in the art after considering this specification and the accompanying drawings which disclose preferred embodiments thereof. All such changes, modifications, variations and other uses and applications which do not depart from the spirit and scope of the invention are deemed to be covered by the invention which is limited only by the claims which follow.

What is claimed is:

1. A method of testing a complex digital circuit designed as a serial access scan path and comprising:
    (a) a plurality of primary inputs;
    (b) a plurality of primary outputs;
    (c) a plurality of flip-flops, some of which are selectively connectable into a scan path shift register;
    (d) a scan path input connected to one end of said shift register; and
    (e) a scan path output connected to the opposite end of said shift register,
said method comprising the steps of:
    (1) forming said scan path shift register in said circuit;
    (2) clearing said scan path shift register;
    (3) applying a first digital test pattern to said primary inputs;
    (4) shifting the first digit of a second digital test pattern into said scan path shift register via said scan path input;
    (5) comparing the digits appearing at said primary outputs with those of a first digital number indicative of the proper operation of said circuit;
    (6) shifting the next digit of said second digital test pattern into said scan path shift register via said scan path input;
    (7) comparing the digits appearing at said primary outputs with those of another digital number indicative of the proper operation of said circuit;
    (8) repeating steps (6) and (7) for each successive digit of said second test pattern until all of the stages of said scan path shift register have been filled by digits of said second digital test pattern; and
    (9) producing a signal indicative of faulty circuit operation if the digits appearing at said primary outputs are not equal to those of the digital numbers to which they are compared.

2. The method defined in claim 1, further comprising the steps of:
    (10) operating said circuit for at least one clock cycle in its normal operating mode;
    (11) comparing the digits appearing at said primary outputs with those of another digital number indicative of the proper operation of said circuit; and
    (12) producing a signal indicative of faulty circuit operation if the digits appearing at said primary outputs are not equal to those of the digital number to which they are compared.

3. The method defined in claim 2, further comprising the steps of shifting the contents of said scan path shift register to a second shift register via said scan path output; comparing the respective digits stored in said second shift register with the digits of a third digital number indicative of the proper operation of said circuit; and producing a signal indicative of faulty circuit operation if the digits stored in said second shift register are not equal to those of said third digital number.

4. The method defined in claim 2, wherein said circuit is operated in step (10) for a plurality of clock cycles.

5. The method defined in claim 4, wherein the number of said clock cycles is determined as follows:
   (1) testing the circuit with one clock cycle and noting the fault coverage;
   (2) repeating step (1) with an additional clock cycle until the fault coverage ceases to increase substantially, thereby to optimize the number of clock cycles between the increase in fault coverage and the increase in testing cost.

* * * * *